US008589775B2

(12) United States Patent
Georgakos et al.

(10) Patent No.: US 8,589,775 B2
(45) Date of Patent: Nov. 19, 2013

(54) ERROR TOLERANT FLIP-FLOPS

(75) Inventors: Georg Georgakos, Fraunberg (DE); Michael Goessel, Mahlow (DE); Anton Huber, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 13/047,090

(22) Filed: Mar. 14, 2011

(65) Prior Publication Data
US 2012/0240014 A1    Sep. 20, 2012

(51) Int. Cl.
G06F 11/00    (2006.01)
(52) U.S. Cl.
USPC .......................................... 714/801; 714/804
(58) Field of Classification Search
USPC .................................................. 714/801, 804
See application file for complete search history.

(56) References Cited

U.S. PATENT DOCUMENTS

| 5,453,999 | A  | * | 9/1995 | Michaelson et al. | 714/805 |
| 7,917,831 | B2 | * | 3/2011 | Millman et al. | 714/763 |
| 2002/0129214 | A1 | * | 9/2002 | Sarkar | 711/162 |
| 2003/0026161 | A1 | * | 2/2003 | Yamaguchi et al. | 365/230.03 |
| 2004/0202034 | A1 | * | 10/2004 | Lee | 365/202 |
| 2006/0015786 | A1 |   | 1/2006 | Mitra et al. | |
| 2008/0294840 | A1 | * | 11/2008 | Bliss et al. | 711/105 |
| 2012/0084628 | A1 | * | 4/2012 | Cox et al. | 714/763 |

FOREIGN PATENT DOCUMENTS

DE    102007024983 A1    11/2008

OTHER PUBLICATIONS

S. Mitra, et al., "Logic Soft Errors a Major Barrier to Robust Platform Design", IEEE International Test Conference, 2005, p. 1-10.

* cited by examiner

*Primary Examiner* — M. Mujtaba K Chaudry
(74) *Attorney, Agent, or Firm* — Eschweiler & Associates, LLC

(57)    ABSTRACT

One embodiment of the present invention relates to an error tolerant memory circuit having a low hardware overhead that can tolerate both single volatile soft errors and permanent errors. In one embodiment, the method and apparatus comprise a memory circuit having a plurality of memory element pairs, respectively having two memory storage elements configured to store a data unit. One or more parity generation circuits are configured to calculate a first parity bit from data written to the plurality of memory element pairs (e.g., the two memory storage elements) and a second parity bit from data read from one of the two memory storage elements in the plurality of memory element pairs. Based upon the calculated first and second parity bits, the memory circuit chooses to selectively output data from memory storage elements not known to contain an error.

20 Claims, 7 Drawing Sheets

ERROR TOLERANT FLIP-FLOPS

BACKGROUND OF THE INVENTION

To ensure the reliability of computer systems, errors in the data that is stored in electronic memory structures may be detected and corrected. Errors in memory have long been detected through the use of parity bits. Parity bits are bits that may be added to a memory structure to ensure the integrity of data stored in the memory. Each time that data is written to a memory, a logic circuit (e.g., a parity generation circuit) examines the data and determines the number of high data states (e.g., "1's"). The parity of the data stored in the memory is computed based upon the number of high data states. In the case of even parity bits, the logic circuit will calculate a parity bit value equal to "1" when the number of high data states in the memory is even and a parity bit value equal to "0" when the number of high data states in a memory is odd. It is also possible to have odd parity bits, wherein the logic circuit will calculate a parity bit value equal to "1" when the number of high data states in the memory is odd and a parity bit value equal to "0" when the number of high data states in a memory is even. When data is read back from the memory, the logic circuit reads back the bits and again determines a parity bit value (e.g., if there are an odd or an even number of ones). Comparison of the parity bit values can detect an error in the memory.

For example, FIG. 1 shows a block diagram of a memory 102 configured to store a data byte comprising eight data bits 104$a$-104$g$ and a parity bit 106 at a first time $T_1$, when data is written into the memory, and at a later time $T_2$, when data is read from the memory. At time the memory 102 stores a data byte having an odd number of bits having a data value of "1" (e.g., 104$b$, 104$e$, 104$f$), resulting in an even parity bit 106 having a value of "1". Between time $T_1$ and time $T_2$ an event occurs that causes a value of the data bit stored in memory element 104$d$ to change its value from "0" to "1". Therefore, at the later time $T_2$, the memory 102' stores a data byte having an even number of bits having a data value of "1" (e.g., 104$b$, 104$d$, 104$e$, 104$f$), resulting in an even parity bit 106 having a value of "0". Because the value of the parity bit 106 at time $T_1$ is different than the value of the parity bit 106 at time $T_2$, an error is present in the memory.

While parity bits may easily detect single bit errors, the use of parity bits to correct data (e.g., as done in Hamming-Code schemes) requires a large increase in hardware and energy consumption of an integrated circuit and therefore is not desirable. Alternatively, data may be detected and corrected by the implementation of majority decision-makers or voters. However, such methods also use large chip areas and consume large amounts of power.

BRIEF DESCRIPTION OF THE DRAWINGS

FIG. 4$b$ illustrates an exemplary operation of a 3-bit error tolerant memory circuit when an error is present in the memory.

FIG. 8$b$ illustrates an exemplary operation of the error tolerant memory circuit of FIG. 8$a$ when errors are present in the memory.

DETAILED DESCRIPTION OF THE INVENTION

Figure 1:
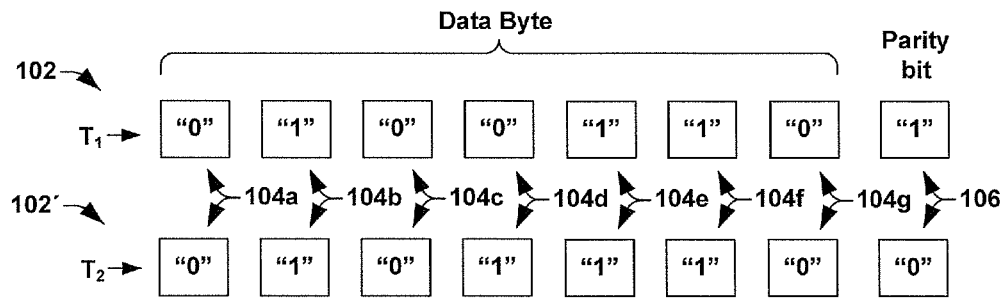
FIG. 1 illustrates an exemplary data byte having an even parity bit at a first and second time.

The present invention will now be described with reference to the attached drawing figures, wherein like reference numerals are used to refer to like elements throughout, and wherein the illustrated structures and devices are not necessarily drawn to scale.

Some aspects of the present disclosure provide for an error tolerant memory circuit having a low hardware overhead that can tolerate both single volatile soft errors and permanent errors. In one embodiment, the method and apparatus comprise a memory circuit having a plurality of memory element pairs, respectively having two memory storage elements configured to store a data unit. One or more parity generation circuits are configured to calculate a first parity bit from data written to the plurality of memory element pairs (e.g., the two memory storage elements) and a second parity bit from data read from one of the two memory storage elements in the plurality of memory element pairs. Based upon the calculated first and second parity bits, the memory circuit chooses to selectively output data from memory storage elements not known to contain a data error.

For example, in one embodiment the memory circuit comprises a plurality of memory element pairs, respectively having a first memory storage element and a second memory storage element that are configured to store a data bit. A first parity generation circuit is configured to calculate a first parity bit based upon data written to the plurality of memory element pairs, while a second parity generation circuit is configured to calculate a second parity bit based upon data read from the second memory storage elements. The first and second parity bits are provided to a control unit configured to compare a stored copy of the first parity bit with the real time second parity bit and to generate a control signal based upon the comparison. The control signal is provided to one or more selection circuits that selectively output data from a first memory storage element if a relationship between the first and second parity bits indicates that no error is present in the first memory storage elements, or from a second memory storage element if a relationship between the first and second parity bits indicates that an error is present in the first storage memory elements.

Figure 2:
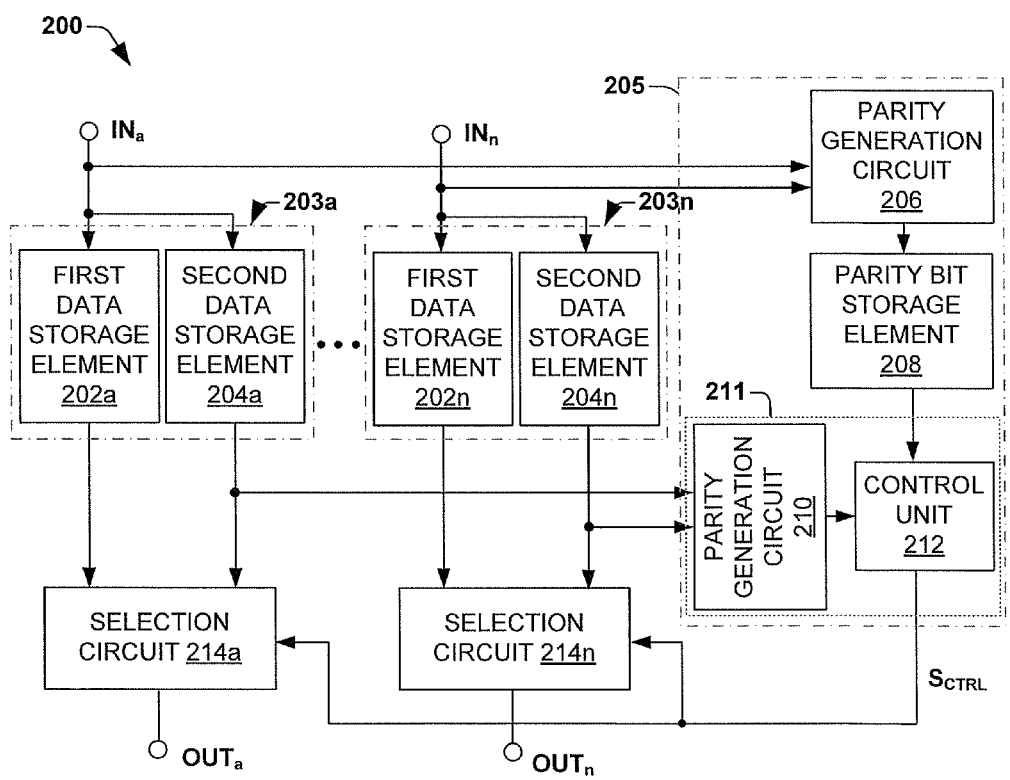
FIG. 2 illustrates a block diagram of a first embodiment of an error tolerant memory circuit.

FIG. 2 illustrates a block diagram of a first embodiment of an error tolerant memory circuit 200. As shown in FIG. 2, the memory circuit 200 comprises a plurality of input nodes $IN_a$, ..., $IN_n$ configured to provide data to a plurality of memory element pairs 203$a$, ..., 203$n$. Each memory element pair 203 has a first memory storage element 202 (e.g., flip-flops, latches, etc.) and a second memory storage element 204 configured to store a data unit. In one embodiment the first and second memory storage elements within each respective memory cell (e.g., 203a, . . . , 203n) may be configured to redundantly store a data unit comprising a single binary data value provided at a respective input node $IN_x$, so that two memory storage elements (e.g., 202a and 204a) are allocated for the storage of each single binary data value (e.g., during normal, error free, operation the first and second memory storage elements will store the same single binary data value). In alternative embodiments, first and the second memory storage elements may be configured to store a data unit comprising several binary data values of wordlength m (where m>1) or an analog value which can be interpreted as a binary value of wordlength m by use of different threshold values.

The inputs and outputs of the memory element pairs 203 are coupled to a parity bit comparison logic 205 configured to calculate a first parity bit from data written to the plurality of memory element pairs and a second parity bit from data read from one of the two memory storage elements in the plurality of memory element pairs. In one embodiment, the parity bit comparison logic 205 may comprise comprising a first parity generation circuit 206, a parity bit storage element 208, a second parity generation circuit 210, and a control unit 212.

The first parity generation circuit 206, coupled to the input nodes $IN_x$ of the memory circuit 200, is configured to compute the first parity bit value based upon data written to the plurality of memory element pairs 203a, . . . , 203n. The first parity bit value is provided by the first parity generation circuit 206 to the parity bit storage element 208, which is configured to store the first parity bit value corresponding to data stored in the plurality of element pairs 203a, . . . , 203n.

The second parity generation circuit 210, coupled to the output of the second memory storage elements 204a, . . . , 204n, is configured to compute a real time, second parity bit value based upon the value of the data read from the second memory storage elements 204a, . . . , 204n. The value of the stored first parity bit and the second real time parity bit are provided to the control unit 212. It will be appreciated that in one embodiment the second parity generation circuit 210 and the control unit 212 may comprise a single logic element 211.

The control unit 212 is configured to generate a control signal $S_{CTRL}$ based upon the received first and second parity bit values. The control signal $S_{CTRL}$ is provided to a plurality of selection circuits 214a, . . . , 214n, respectively configured to output data that is selected from data stored in a first memory storage element 202 or data stored in a second memory storage element 204. In various embodiments, the control unit 212 may comprise various logic elements. In one example, the control unit 212 may comprise an exclusive OR (XOR) gate so that if the first and second parity bits are equal a low data state is output, while if the first and second parity bits are not equal a high data state is output. Alternatively, the control unit 212 may comprise some other type of logic circuit (e.g., an XNOR-gate).

In one embodiment, the control unit 212 may be configured to compare the value of the stored first parity bit and the real time second parity bit. If no error is present in the second memory storage elements 204a, . . . , 204n, then the comparison will indicate that the data written to the second memory storage elements is the same as the data being read out of the second memory storage elements. Accordingly, the control unit 212 provides a control signal $S_{CTRL}$ to the selection circuits 214 causing the selection circuits to output the data stored in the second memory storage elements 204. If an error is present in one of the second memory storage elements 204, then the first and second parity bits will indicate that the data written to the second memory storage elements is not the same as the data being read out of the second memory storage elements. Accordingly, so as to not output the data that is known to be incorrect, the control unit 212 provides a control signal $S_{CTRL}$ to the selection circuits 214 causing the selection circuits to output the data stored in the first memory storage elements 202 (e.g., stored data that is not known to be incorrect).

Although FIG. 2 describes the second parity generation circuit 210 as being coupled to the output of the second memory storage elements 204, it will be appreciated that the second parity generation circuit 210 may be coupled to either the first memory storage elements 202a, . . . , 202n or the second memory storage elements 204a, . . . , 204n. Also, for each memory element pair 203 with two storage elements it can be individually determined whether the second parity generation circuit 210 is coupled to the output of the first or the second storage element. For example, the second parity generation circuit 210 may be coupled to the output of the first storage element 202a of the first memory element pair 203a, to the output of the second storage element of a second memory element pair to the output of the second storage element of a third memory element pair, to the output of the first storage element of a forth memory element pair, etc.

In either case, if the second parity bit value generated by the second parity generation circuit 210 indicates that there is not an error in the data stored in the memory storage elements that the second parity generation circuit is coupled to, the control unit 212 will generate a control signal that causes the selection circuits 214 to output data from the memory storage elements that the second parity generation circuit is coupled to. Similarly, if the second parity bit value generated by the second parity generation circuit indicates that there is an error in data stored in the memory storage elements that the second parity generation circuit is coupled to, the control unit 212 will generate a control signal that causes the selection circuits 214 to output data from the memory storage elements that the second parity generation circuit is not coupled to. Therefore, the memory circuitry is configured to selectively output data that is either known to not contain data errors (e.g., second memory storage element 204 in FIG. 2) or it will output data that is not known to contain data errors (e.g., first memory storage element 202 in FIG. 2).

As described herein, a parity bit or a parity bit value may refer to an even or an odd parity bit. In various embodiments, the first and second parity bits may comprise even parity bits, odd parity bits, or a combination of even and odd parity bits. For example, in one embodiment, the first and second parity bits may refer to positive parity bits. In an alternative embodiment, the first and second parity bits described herein may refer to odd parity bits. In yet another embodiment, the first parity bit may comprise an even parity bit while the second parity bit may comprise an odd parity bit, or vice versa. One of ordinary skill in the art will appreciate that the choice of parity bits as even or odd parity bits may dictate a specific logic functionality of the control unit.

Furthermore, for the simplicity of presentation the present invention is described in the following description for the case of a single bit being stored in a memory storage element (e.g., in relation to FIG. 3, memory storage elements store a data unit comprising a data bit, for example). However, one of ordinary skill in the art will appreciate that the storage of a single data bit in a memory storage element is a non-limiting embodiment of the invention. For example, In various embodiments the memory storage elements can store a single binary value b with the possible values "0" or "1" of a single bit, several binary values $b_1, \ldots, b_m$ of wordlength m, where m>1, or an analog value that may be interpreted as a binary value of wordlength m through the use of different threshold values. For embodiments where m>1, the parity of a data unit stored in a memory storage element may simply be computed as the XOR-sum of the stored binary values.

Figure 3:
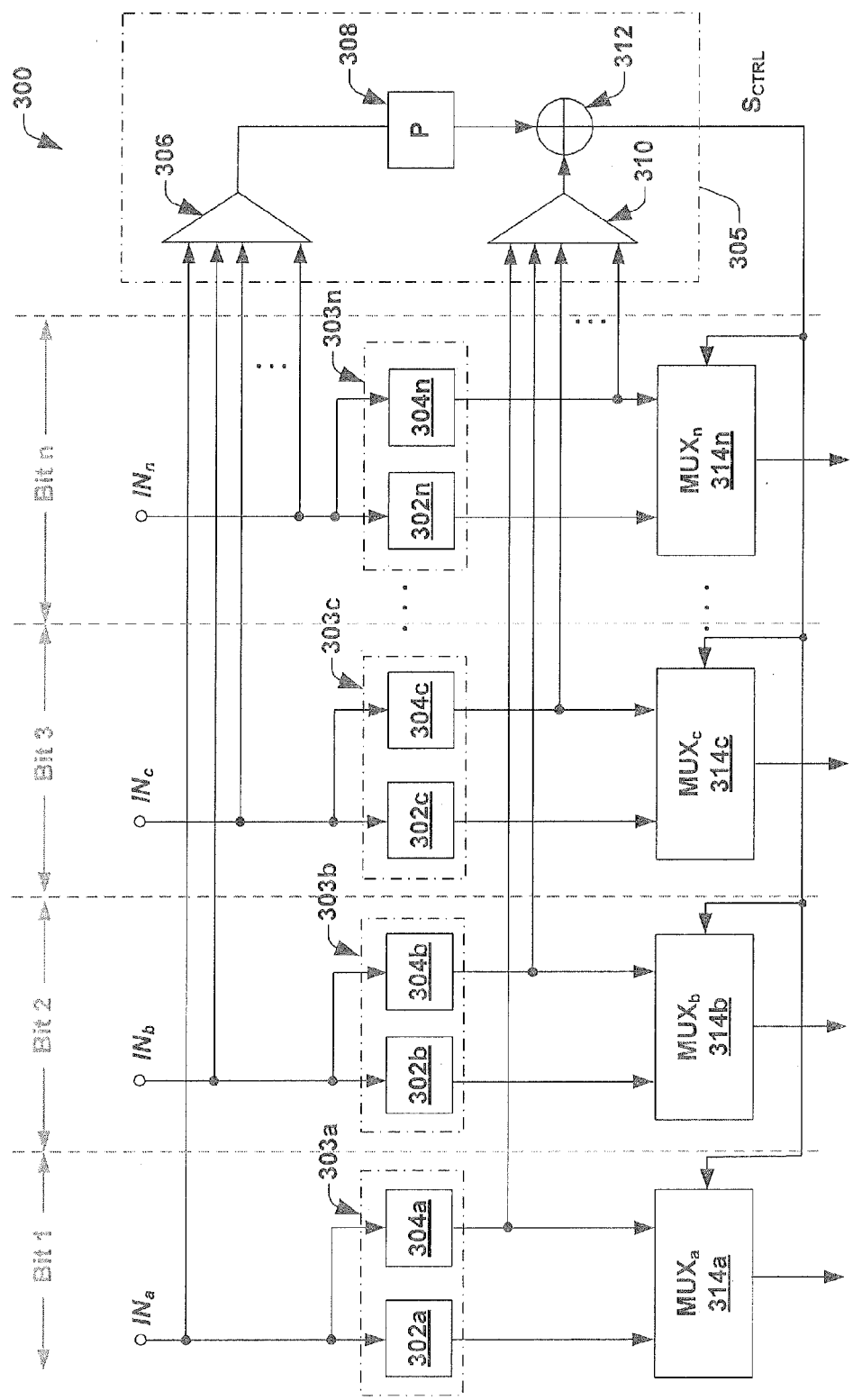
FIG. 3 illustrates a block diagram of a more particular example of an error tolerant memory circuit.

FIG. 3 illustrates a block diagram of a more particular embodiment of an error tolerant memory circuit 300. As shown in FIG. 3, a memory comprises a plurality of 2 n flip-flops, configured as n memory element pairs 303 respectively comprising two flip-flops, 302 and 304, configured to store a data bit.

The memory element pairs 303 are coupled to parity bit comparison logic 305 comprising a first logic element 306, a parity bit storage flip-flop 308, a second logic element 310, and a control unit 312. The first logic element 306 is configured to generate a first parity bit from n bits of data written to the 2 n flip-flops. The first parity bit is formed, based upon the number of high data states in the n bits of data, and is stored in the parity bit storage flip-flop 308. The second logic element 310 is configured to generate a real time second parity bit based upon the number of high data states in the n bits of data read from the 2 n flip-flops.

The control unit 312, comprising an exclusive OR gate (XOR gate), is configured to receive a copy of the first parity bit, from the parity bit storage flip-flop 308, and the real time second parity bit, calculated by the second logic element 310. The XOR gate outputs a control signal $S_{CTRL}$ that is provided to a plurality of multiplexors 314a, ..., 314n. The control signal $S_{CTRL}$ selects which of the two flip-flops, 302 or 304, in a memory element pair 303x (where x=a, ..., n) is chosen to provide data as an output. For example, in the event that the first and second parity bits are equal (e.g., both "0" or both "1") the parity is true indicating no error is present in the flips-flops 304. Therefore, data is output from flip-flops 304. In the event that the first and second parity bits are not equal (e.g., "1" and "0" or "0 and "1") the parity is false indicating that an error is present in the flip-flops 304. Therefore, data is output from flip-flops 302.

Figure 4A:
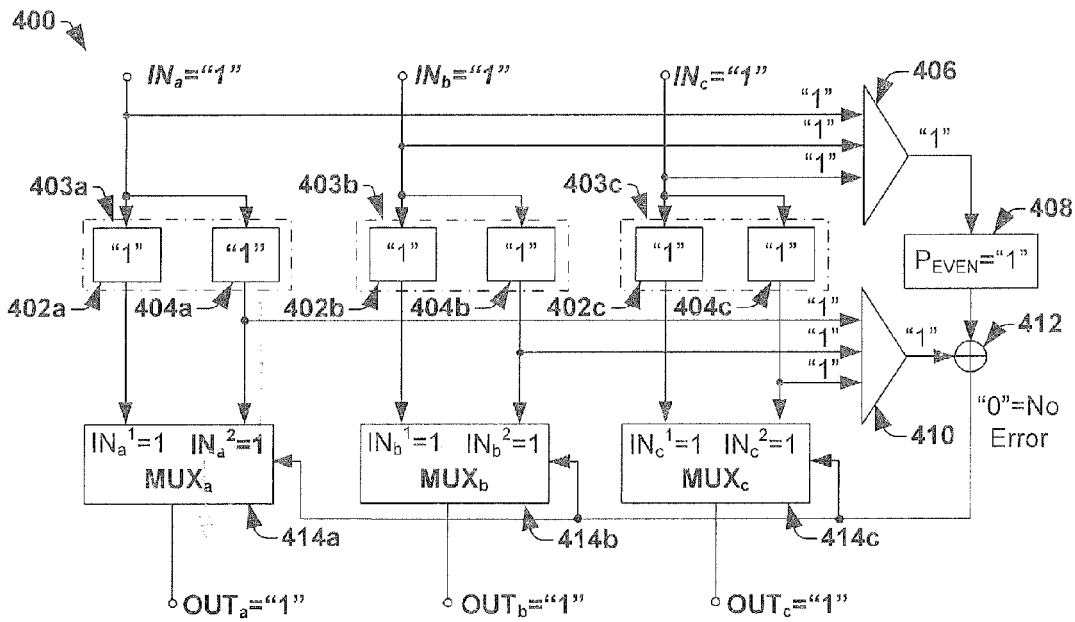
FIG. 4$a$ illustrates an exemplary operation of a 3-bit error tolerant memory circuit when no errors are present in the memory.

FIG. 4a illustrates an exemplary block diagram illustrating the operation of a 3-bit error tolerant memory circuit 400 having no errors. As shown in FIG. 4a, a high data state ("1") is written to each of the three memory element pairs 403a, 403b, and 403c. For example, a high data state ("1") is written to memory storage elements 402 and 404 of a first memory element pair 403a, the second memory element pair 403b, and the third memory element pair 403c. A first logic element 406 is configured to generate a first parity bit from the data written to each the of memory element pairs 403. As shown in FIG. 4a, since a high data state is written to each of the three memory element pairs, the first logic element 406 calculates a first even parity bit having a value of "1". The first parity bit is stored in a parity bit memory storage element 408.

A second logic element 410 is configured to calculate a second parity bit from the data read from memory storage elements 404a, 404b, and 404c. As shown in FIG. 4a, since there is no error present in memory storage elements 404a, 404b, and 404c, the second logic element 410 calculates a second even parity bit having a value of "1". A stored value of the first parity bit and a real time value of the second parity bit are provided to an XOR gate 412. Since each of the parity bits has high data state ("1"), the XOR gate 412 outputs a low data state ("0") to each of the multiplexors 414, which causes the multiplexors 414 to selectively output data from memory storage elements 404. For example, multiplexor 414a receives a control signal having a value of "0", which causes the multiplexor 414a to output data that was input into the multiplexor (at input node $IN_a^2$) from memory storage element 404a. Therefore, the memory circuit 400 outputs data in a manner that chooses to use memory storage elements that it is certain do not contain a known data error.

Figure 4B:
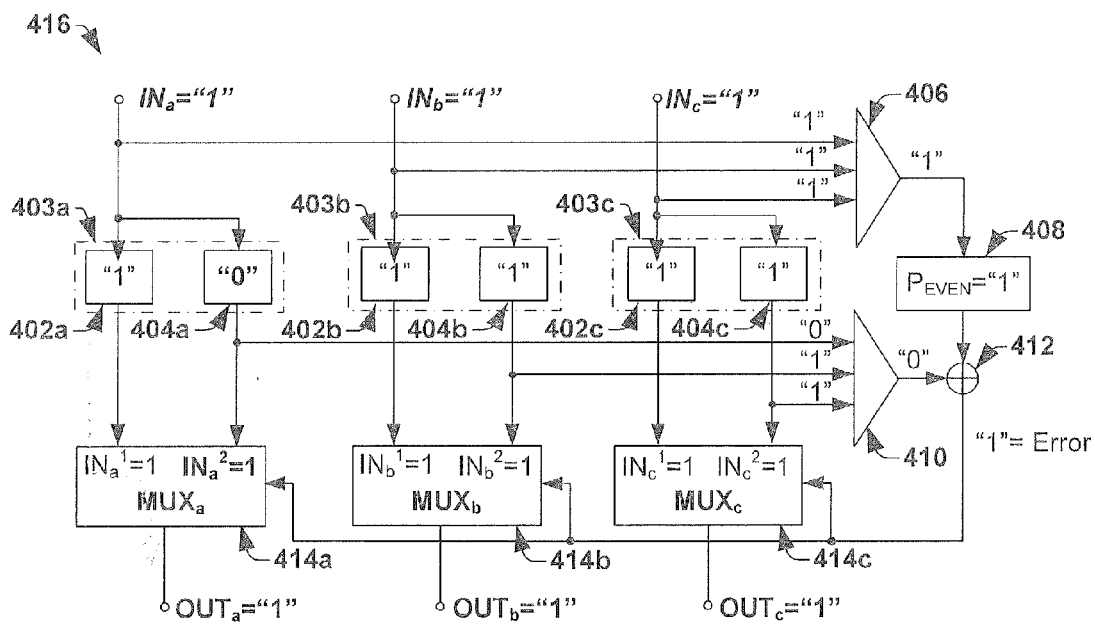

FIG. 4b illustrates an exemplary block diagram illustrating the operation of a 3-bit error tolerant memory circuit 416 having an error. As shown in FIG. 4b, a high data state ("1") is written to each of the three memory element pairs 403a, 403b, and 403c. For example, a high data state ("1") is written to the memory storage elements 402 and 404 of a first memory element pair 403a, the second memory element pair 403b, and the third memory element pair 403c. As shown in FIG. 4b, since a high data state is written to each of the three memory element pairs, the first logic element 406 calculates a first even parity bit having a value of "1". The first parity bit is stored in a parity bit memory storage element 408.

A second logic element 410 is configured to generate a second parity bit from the data read from memory storage elements 404a, 404b, and 404c. As shown in FIG. 4b, since there is an error present in memory storage element 404a, the second logic element 410 calculates a second even parity bit having a value of "0". A stored value of the first parity bit and a real time value of the second parity bit are provided to XOR gate 412. Since the first parity bit has a high data state ("1") and the second parity bit has a low data state ("0"), the XOR gate 412 outputs a high data state ("1") to each of the multiplexors 414, which causes the multiplexors 414 to selectively output data from memory storage elements 402. For example, multiplexor 414a receives a control signal having a value of "1", which causes multiplexor 414a to output data that was input into the multiplexor (at input node $IN_a^1$) from memory storage element 402a. Therefore, the memory circuit 416 outputs data in a manner that chooses not to use memory storage elements that contain a known data error.

The inventors have appreciated the difficulty of implementing memory circuits into an error tolerant configuration within typical integrated chip (IC) layouts/designs. Therefore, in various embodiments, the components of the error tolerant memory circuit provided herein (e.g., the memory circuits of FIGS. 2, 3, etc.) may be comprised within one or more integrated chip layout standard cells to facilitate the incorporation of one or more memory storage elements, which are robust against single errors, into an integrated chip layout/design.

Figure 5:
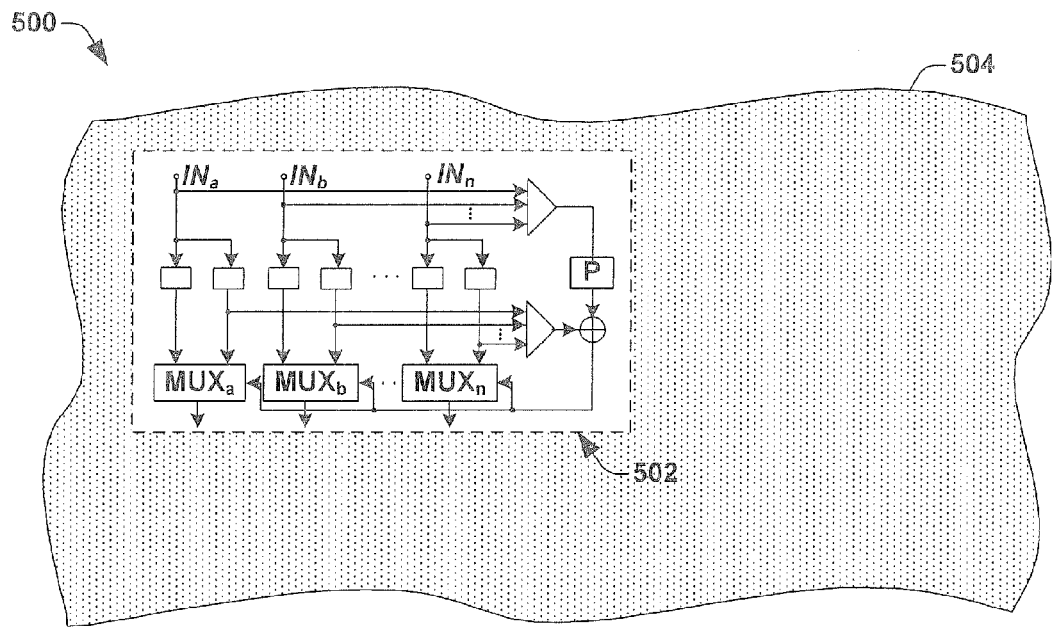
FIG. 5 illustrates an exemplary block diagram of an integrated chip (IC) layout having a standard cell comprising an error tolerant memory circuit comprised within a larger IC layout.

For example, in one embodiment, to facilitate the implementation of error tolerant memory circuits into an IC layout, the error tolerant memory storage functionality described herein may be incorporated into a single integrated chip layout standard cell, which can be incorporated into a more complex IC design. FIG. 5 illustrates an exemplary block diagram of an integrated chip layout 500 having a standard cell 502 comprising an error tolerant memory circuit comprised within a larger IC layout 504. As shown in FIG. 5, components of a memory circuit (e.g., a plurality of memory storage elements, parity generation circuits, etc.) are comprised within a single integrated chip layout standard cell 502 (e.g., kept in a standard cell library) that may be selectively placed into an IC layout 504 to replace a number of data storage elements that are not easily configured to provide error tolerant data storage. For example, four data storage elements (e.g., flip-flops), configured to store 4 data bits, may be replaced with a single integrated chip standard cell having four memory element pairs, parity generation logic, and the same input and output signals as the four data storage elements, so as to make a memory circuit that stores 4 data bits that are robust against single errors.

Since placement of memory storage elements in a small geographic area such as a single integrated chip standard cell may increase the likelihood of multiple errors, in some embodiments it may be beneficial to implement minimum spacing between components (e.g., memory storage elements, memory element pairs) of a memory circuit to improve the error tolerance of the memory circuit.

More particularly, one of ordinary skill in the art will appreciate that memory errors may occur due to a wide range of causes including some that individually effect memory storage elements. For example, soft errors may be caused by incident alpha particles such that if an error is present in one of the two memory storage elements of a memory element pair, then statistically an error will not be present in the other memory storage element of the memory element pair. Alternatively, errors may also be due to causes that may cause errors within a geographical region of a memory. For example, a wafer defect may cause a geographical region of a chip to have errors, thereby effecting memory storage elements comprised within a spatial region.

Figure 6:
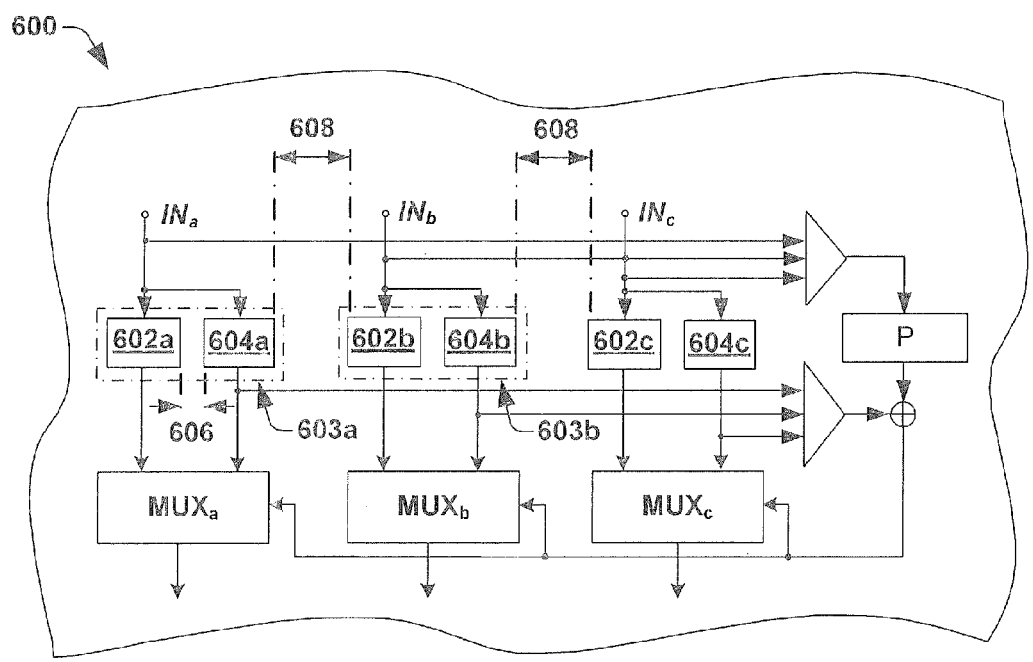
FIG. 6 illustrates an error tolerant memory circuit wherein respective memory components are separated by a minimum distance.

Therefore, to prevent the occurrence of multiple errors in an error tolerant memory circuit, in some embodiments memory storage elements of a memory element pair and/or memory element pairs of a memory circuit may be separated by a minimum distance (e.g., 10 um, twice the size of a memory storage element). FIG. 6 illustrates a memory circuit 600 wherein respective memory components are separated by a predetermined minimum distance (e.g., implemented as one or more layout design rules). For example, in a first memory element pair 603a, a first memory storage element 602a is separated from a second memory storage element 604a by a predetermined minimum distance 606. Furthermore, in additional and/or alternative embodiments, a first memory element pair 603a may be separated from a second memory element pair 603b by a predetermined minimum distance 608. In various embodiments, the predetermined minimum distance 606 between the first and second memory storage elements may be different than or equal to the minimum distance 608 between different memory element pairs.

Figure 7:
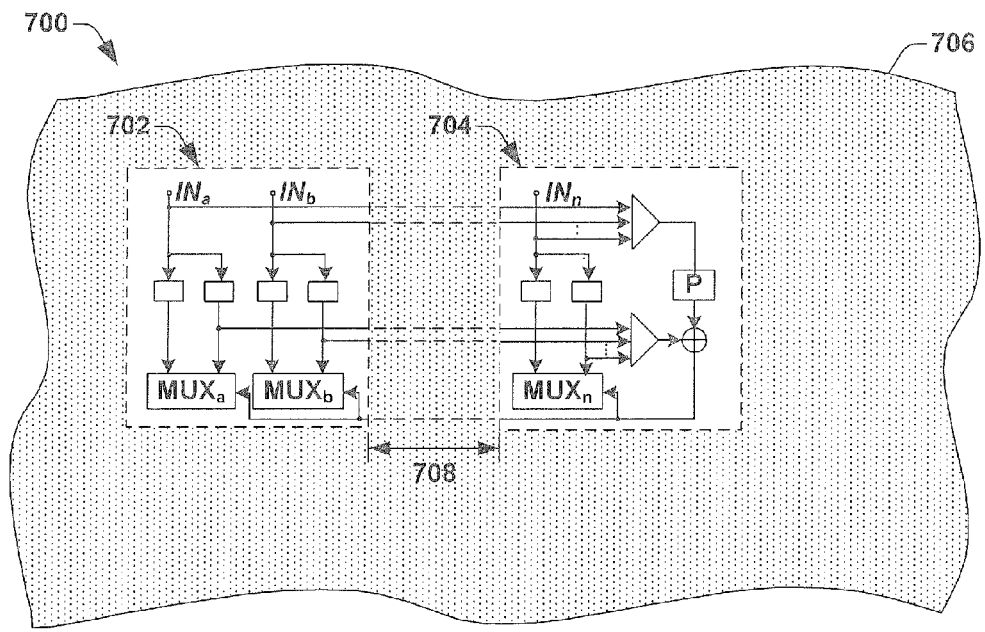
FIG. 7 illustrates an exemplary block diagram of an integrated chip layout having an error tolerant memory circuit comprised within multiple standard cells.

In some embodiments, memory circuit complexity, or separation of memory elements by a minimum spacing, may increase the size of the memory circuit to a sufficiently large size so as to cause the memory circuit to be implemented as a plurality (i.e., more than one) of integrated chip layout standard cells. Such separation of a memory circuit into a plurality of standard cells may facilitate routing and even further reduce the probability of multiple errors by providing additional spacing between memory elements For example, FIG. 7 illustrates an exemplary block diagram of an integrated chip layout 700 having an error tolerant memory circuit comprised within multiple integrated chip layout standard cells comprised within a larger IC layout 706. As shown in FIG. 7, first and second multiplexors. MUX$_a$ and MUX$_b$, and associated memory storage elements are comprised within a first integrated chip layout standard cell 702, while a third multiplexor MUX$_n$, associated memory storage elements, and parity bit comparison logic are part of a second integrated chip layout standard cell 704. In one embodiment, the first integrated chip layout standard cell 702 may be separated from the second integrated chip layout standard cell 704 by a minimum distance 708. The inventors have appreciated that in alternative embodiments, the components of an error tolerant memory circuit (e.g., memory storage elements, parity generation circuits, etc.) may be divided in alternative ways between two or more integrated chip layout standard cells.

Figure 8A:
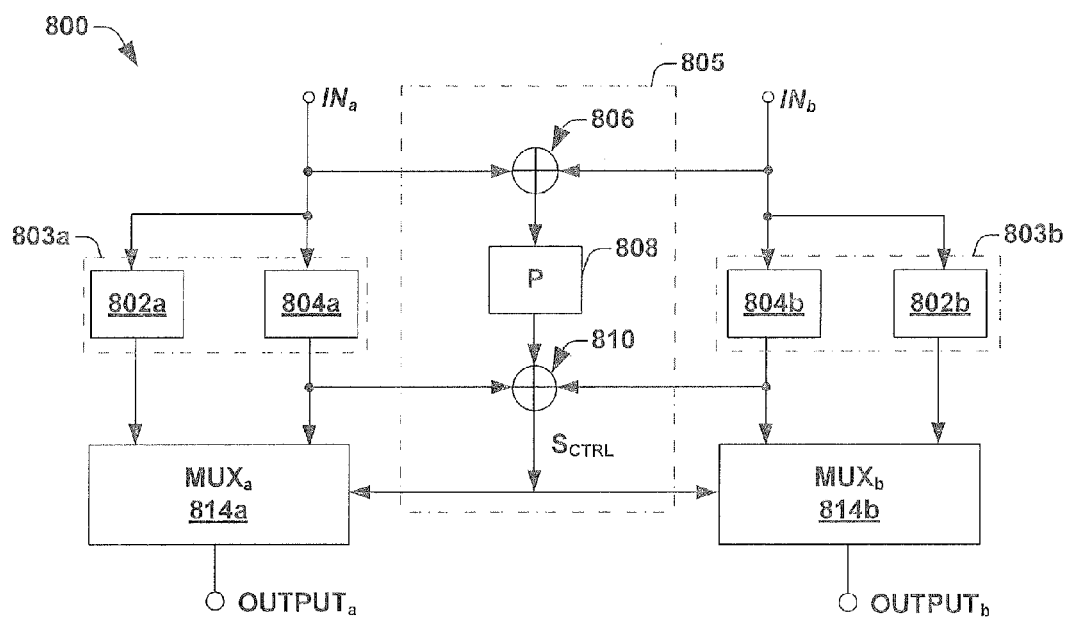
FIG. 8$a$ illustrates a block diagram of an alternative embodiment of a 2-bit error tolerant memory circuit comprising two memory element pairs symmetrically arranged around parity bit comparison logic.

FIG. 8a illustrates an alternative embodiment of a 2-bit error tolerant memory circuit 800 wherein parity bit comparison logic 805 is spatially positioned between two memory element pairs 803. FIG. 8a illustrates parity bit comparison logic 805 comprising a first parity generation circuit 806, a parity bit memory storage element 808, and a control logic element 810. The parity bit comparison logic 805 is disposed at a position that is spatially located between a first memory element pair 803a and a second memory element pair 803b.

In one embodiment, the first and second memory element pairs, 803a and 803b, may be symmetrically positioned around the parity bit comparison logic 805. By positioning the parity bit comparison logic 805 spatially between two memory element pairs 803a and 803b, the layout of the memory circuit is simplified so that the memory circuit 800 does not contain any crossing of signal routing wires.

Furthermore, as illustrated in FIG. 8a, the parity bit comparison logic 805 comprises a first parity generation circuit 806 and a control logic element 810 that comprise simple XOR logic gates or in alternative embodiments some other simple logic element. The use of simple XOR logic gates allows for a simplified design. For example, control logic element 810 generates a control signal based upon a received stored first parity bit value from the parity bit storage element 808 and data read from memory storage elements 804a and 804b. Therefore, the control logic element 810 performs the functionality of both a parity generation circuit and a control unit described above. It will be appreciated that the control logic element 810 shown in FIG. 8a may also be implemented into other memory circuit designs (e.g., as shown in FIG. 2 or 3).

Figure 8B:
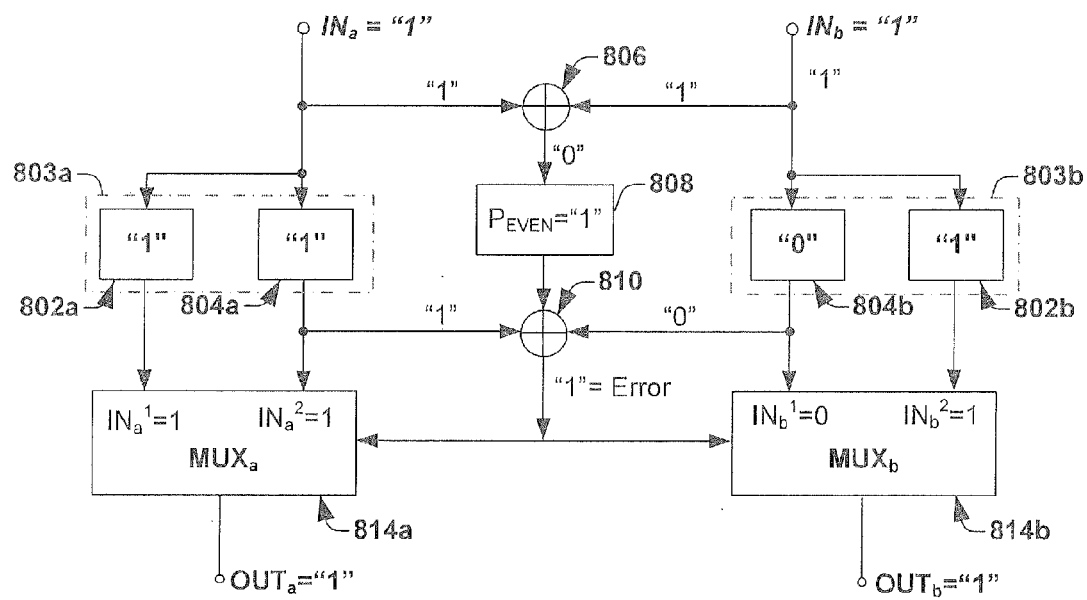

FIG. 8b illustrates an exemplary block diagram illustrating the operation of the 2-bit error tolerant memory circuit shown in FIG. 8a, when an error is present in the memory storage elements. As shown in FIG. 8b, a high data state ("1") is written to each of the two memory element pairs, 803a and 803b. For example, a high data state is written to the first and second memory elements 802 and 804 of the first memory element pair 803a and the second memory element pair 803b. A first parity generation circuit 806 is configured to generate a first parity bit from the data written to the memory element pairs. As shown in FIG. 8b, since a high data state is written to each of the memory element pairs, the parity generation circuit 806 calculates an even parity bit having a value of "1". The first parity bit is stored in a parity bit memory storage element 808.

A control logic element 810 is configured to generate a control signal $S_{CTRL}$ from the first parity bit and data written to memory storage elements 804a and 804b. As shown in FIG. 8b, since there is an error present in memory storage element 804b, the control logic element 810 is configured to generate a control signal having a value of "1". The control signal having a value of "1" is provided to multiplexors 814a and 814b, causing the multiplexors to selectively output data from memory storage elements 802. Therefore, the memory circuit outputs data in a manner that chooses not to use memory storage elements that contain a known data error.

Figure 9:
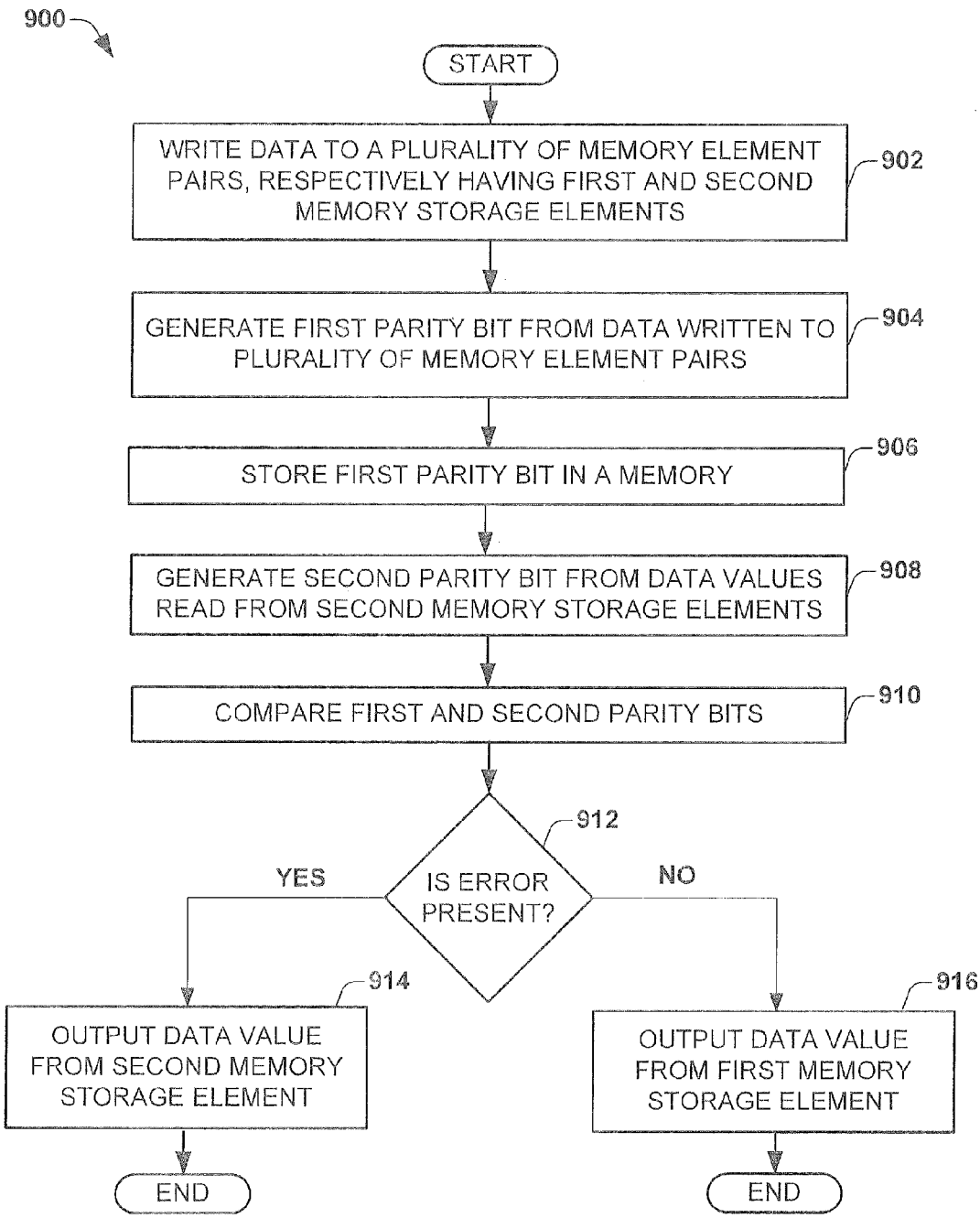
FIG. 9 is a flow diagram illustrating a method for removing the effect of errors from a memory array.

FIG. 9 illustrates a flow diagram of an exemplary method 900 for removing the effect of errors from a memory circuit. The method selectively outputs data in a manner that chooses not to use memory storage elements that contain a known data error (e.g., a difference in calculated parity with respect to the data bits that are written to the memory).

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. For example, it will be appreciated that in one embodiment the generation of a second parity bit (step 908) and the comparison of the first and second parity bits (step 910) may be performed in real time, whereas writing data to memory element pairs (step 902) and generating and storing a first parity bit (steps 904-906) occur during each new write cycle of the memory storage elements.

At 902 data is written to a plurality of memory element pairs, respectively comprising first and second memory storage elements. In particular, data comprising a data bit having a data bit value are written to memory element pairs comprising a pair of two memory storage elements both allocated to store the data bit value.

At 904 a first parity bit is generated from data written to the plurality of memory element pairs. In particular, the first parity bit is generated from data that is written to respective pairs of first and second memory storage elements. The first parity bit may comprise and even or odd parity bit generated by determining the number of high data states that are being written to the memory storage elements.

At 906 the first parity bit is stored in a memory.

At 908 a real time, second parity bit is generated from data read from the second memory storage elements. As stated above, the first and second parity bit may comprise even parity bits, odd parity bits, or a combination of even and odd parity bits (e.g., the first parity bit may be an even parity bit and the second parity bit may be an odd parity bit, or vice versa).

At 910 a stored copy of the first parity bit is compared to the real time, second parity bit. Comparison of a stored value of the first parity bit with the real time value of the second parity bits is indicative of whether or not an error is present in the data stored in the second memory storage elements. For example, in one embodiment if the first and second parity bit values are the same then no error is present in the second memory storage elements, while if the first and second parity bit values are not the same then an error is present in the second memory storage elements.

It will be appreciated that the comparison of the first and second parity bits may be affected by the convention of the parity bits (e.g., odd parity bit or even parity bit). For example, in an embodiment wherein the second parity bit may be calculated in the same manner as the first parity bit to so that the first and second parity bits follow the same convention (e.g., are both even or odd parity bits). In such an embodiment, if the first and second parity bits are equal then no error is present in the second memory storage elements. However, if the first and second parity bits are not the same an error is present in the data bits stored in the second memory storage element. Alternatively if the first and second parity bits follow a different convention, then agreement between the parity bits would indicate an error and disagreement would indicate no error.

If the comparison indicates no error is present in the second memory storage elements (box 912), the method 900 proceeds to box 914 where the data is output from the second memory storage elements. Alternatively, if the comparison indicates an error is present in one of the second memory storage elements (box 912), the method 900 proceeds to box 916 where the data is output from the first memory storage elements. Therefore, based upon the comparison, the method selectively outputs data from memory storage elements that are either known to not contain data errors that are not known to contain data errors.

It will be appreciated that although the memory elements are shown in the figures provided herein as being arranged in a linear geometry that the memory elements may be arranged in a non-linear. For example, in one embodiment, the individual memory elements of a memory element pair may be arranged along a first direction while the memory element pairs are arranged along a second direction different than the first direction.

Furthermore, although the invention is described in relation to memory element pairs (e.g., FIG. 2, element 203) that are configured to store a data unit (e.g., data bit), it will be appreciated that the invention is not limited to memory element pairs comprising two separate memory elements. Rather the invention may be applied to storage structures configured to store a data unit, wherein the storage structures have a number of memory elements greater than two (e.g., 3, 4, . . . , m data storage elements), for example.

Although the invention has been illustrated and described with respect to one or more implementations, alterations and/or modifications may be made to the illustrated examples without departing from the spirit and scope of the appended claims. For example, although the invention has been described herein with respect to soft errors, one of ordinary skill in the art will appreciate that the method and apparatus provided herein may also be applied to permanent memory errors. Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:
1. A memory circuit, comprising:
a plurality of memory element pairs respectively configured to store a data unit, wherein respective memory element pairs comprise a first memory storage element and a second memory storage element; and a parity bit comparison logic configured to calculate a first parity bit by collectively using data written to each of the plurality of memory element pairs and a real time second parity bit by collectively using data read from each of second memory storage elements, to store the first parity bit as a stored first parity bit, and to generate a control signal that is provided to one or more selection circuits based upon a relationship between the stored first parity bit and the real time second parity bit, wherein the control signal causes the one or more selection circuits to selectively output data from the second memory storage element if the relationship indicates that no error is present in the second memory storage elements, or from the first memory storage element if the relationship indicates that an error is present in the second memory storage elements.

2. The memory circuit of claim 1, wherein the parity bit comparison logic comprises:
 a first parity generation circuit configured to calculate the first parity bit based upon data written to the plurality of memory element pairs;
 a parity bit memory storage element configured to store the first parity bit;
 a second parity generation circuit configured to calculate the real time second parity bit based upon data read from the first memory storage elements; and
 a control unit configured to receive the stored first parity bit and the real time second parity bit and to perform a comparison between the first and second parity bits to determine the relationship between the first and second parity bits.

3. The memory circuit of claim 2, wherein the control unit comprises an XOR logic gate.

4. The memory circuit of claim 1, wherein respective selection circuits comprise a multiplexor configured to selectively output data from the first or second memory storage elements based upon the control signal.

5. The memory circuit of claim 1, wherein components of the memory circuit are comprised within a single integrated chip layout standard cell.

6. The memory circuit of claim 1, wherein components of the memory circuit are separated into more than one integrated chip layout standard cell.

7. The memory circuit of claim 1, wherein the first memory storage elements and the second memory storage elements comprise flip-flops.

8. The memory circuit of claim 1, wherein the plurality of memory element pairs comprises a first memory element pair and a second memory element pair, and
 wherein the parity bit comparison logic is spatially disposed at a position that is between the first memory element pair and the second memory element pair.

9. The memory circuit of claim 1, wherein the plurality of memory element pairs are separated by a predetermined minimum distance.

10. The memory circuit of claim 1, wherein the first and second memory storage elements of respective memory element pairs are separated by a predetermined minimum distance.

11. An integrated circuit, comprising:
 a memory circuit comprised within one or more integrated chip layout standard cells, the memory circuit comprising:
  a plurality of memory element pairs respectively configured to store a data unit, wherein respective memory element pairs comprise a first memory storage element and a second memory storage element;
  a first parity generation circuit configured to calculate a first parity bit by collectively using data written to each of the plurality of memory element pairs, wherein the first parity bit is stored in a parity bit memory storage element as a stored first parity bit;
  a second parity generation circuit configured to calculate a real time second parity bit by collectively using data read from the second memory storage element within each of the plurality of memory element pairs;
  a control unit configured to receive and compare the stored first parity bit with the real time second parity bit to determine a relationship between the first and second parity bits; and
  a plurality of selection circuits configured to selectively output data from the first memory storage element if a first predetermined relationship exists between the first parity bit and the real time second parity bit, and to selectively output data from the second memory storage element if a second predetermined relationship exists between the first parity bit and the real time second parity bit.

12. The integrated circuit of claim 11, wherein the first memory storage elements and the second memory storage elements comprise flip-flops.

13. The integrated circuit of claim 11, wherein the plurality of memory element pairs comprises a first memory element pair and a second memory element pair, and wherein the first parity generation circuit, the second parity generation circuit, and the control unit are located at a position that is spatially positioned between the first memory element pair and the second memory element pair.

14. The integrated circuit of claim 11, wherein the memory circuit is comprised within a single integrated chip layout standard cell.

15. The integrated circuit of claim 11, wherein the plurality of memory element pairs are separated by a predetermined minimum distance, and
 wherein the first and second memory storage elements of respective memory element pairs are separated by a predetermined minimum distance.

16. A method for removing the effect of errors from a memory circuit, comprising:
 generating a first parity bit by collectively using data values written to each of a plurality of memory element pairs, respectively comprising first and second memory storage elements;
 storing the first parity bit in a parity bit memory storage element as a stored first parity bit;
 generating a real time second parity bit by collectively using data values stored in the second memory storage element within each of the plurality of memory element pairs; and
 selecting data to output from the first or second memory storage elements based upon a relationship between the stored first parity bit and the real time second parity bit, wherein data is output from the second memory storage element if the relationship indicates that no error is present in the second memory storage element within each of the plurality of memory element pairs, or from the first memory storage element if the relationship indicates that an error is present in the second memory storage element within each of the plurality of memory element pairs.

17. The method of claim 16, further comprising comparing the stored first parity bit with the real time second parity bit to determine the relationship between the stored first parity bit and the real time second parity bit.

18. The method of claim 16, wherein if the stored first parity bit is equal to the real time second parity bit, data is selected to be output from a second memory storage element, and wherein if the stored first parity bit is not equal to the real time second parity bit, data is selected to be output from a first memory storage element.

19. The method of claim 16, the memory element pairs are comprised within more than one integrated chip layout standard cell.

20. The method of claim 16, the memory element pairs are comprised within a single integrated chip layout standard cell.

* * * * *